United States Patent
Kang et al.

(10) Patent No.: US 10,550,465 B2
(45) Date of Patent: Feb. 4, 2020

(54) METHOD OF PREPARING FOR REACTOR RESTART FOR MANUFACTURING EPITAXIAL WAFER

(71) Applicant: SK SILTRON CO., LTD., Gumi-si, Gyeongsangbuk-do (KR)

(72) Inventors: Dong-Ho Kang, Gumi-si (KR); Man-Kee Cho, Gumi-si (KR)

(73) Assignee: SK Siltron Co., Ltd., Gumi-si (KR)

( * ) Notice: Subject to any disclaimer, the term of this patent is extended or adjusted under 35 U.S.C. 154(b) by 102 days.

(21) Appl. No.: 15/745,387

(22) PCT Filed: Jul. 26, 2016

(86) PCT No.: PCT/KR2016/008176
§ 371 (c)(1),
(2) Date: Jan. 16, 2018

(87) PCT Pub. No.: WO2017/018789
PCT Pub. Date: Feb. 2, 2017

(65) Prior Publication Data
US 2019/0093215 A1    Mar. 28, 2019

(30) Foreign Application Priority Data
Jul. 28, 2015 (KR) ..................... 10-2015-0106318

(51) Int. Cl.
*C30B 25/02* (2006.01)
*C23C 16/02* (2006.01)
(Continued)

(52) U.S. Cl.
CPC ...... *C23C 16/0236* (2013.01); *C23C 16/4405* (2013.01); *C23C 16/4408* (2013.01); *C30B 25/10* (2013.01)

(58) Field of Classification Search
CPC .......... C30B 23/00; C30B 25/02; C30B 25/04
See application file for complete search history.

(56) References Cited

U.S. PATENT DOCUMENTS 9,638,376 B2 * 5/2017 Kang ................... F17D 3/00
2008/0245767 A1   10/2008 Kim et al.
(Continued)

FOREIGN PATENT DOCUMENTS

JP    7-206586       8/1995
JP    10-125603 A   5/1998
(Continued)

OTHER PUBLICATIONS

Japanese Office Action dated Feb. 19, 2019 for corresponding JP Application No. 2018-504136 (4 pages).
(Continued)

*Primary Examiner* — Robert M Kunemund
(74) *Attorney, Agent, or Firm* — Lewis Roca Rothgerber Christie LLP

(57) ABSTRACT

As a process of preparing for a restart of an epitaxial reactor in which epitaxial growth for a wafer is performed, an embodiment includes injecting a nitrogen gas into a process chamber provided in the epitaxial reactor and purging the gas for a predetermined time; heating the inside of the process chamber non-linearly according to time; and measuring MCLT for the epitaxial wafer after growing the epitaxial wafer. A method of preparing for a restart of an epitaxial reactor of the embodiment removes moisture and contaminants stagnated inside the process chamber at a higher rate compared to the related art and also reduces a time to reach the minimum value of MCLT for preparing for a restart of an epitaxial reactor, and thus a time for preparing for a restart of an epitaxial reactor may also be reduced.

19 Claims, 4 Drawing Sheets

(51) Int. Cl.
　　　 C23C 16/44　　　　(2006.01)
　　　 C30B 25/10　　　　(2006.01)

(56) References Cited

U.S. PATENT DOCUMENTS

2009/0038540 A1* 2/2009 Yoshida .................. C23C 16/24
　　　　　　　　　　　　　　　　　　　　　117/85
2013/0153961 A1　　6/2013　Cody et al.

FOREIGN PATENT DOCUMENTS

| JP | 2003-86518 A | 3/2003 |
| JP | 2004-260086 A | 9/2004 |
| JP | 2009-117644 | 5/2009 |
| JP | 2012-94615 A | 5/2012 |
| JP | 2012-222284 | 11/2012 |
| JP | 2014-99479 A | 5/2014 |
| JP | 2014-103328 | 6/2014 |
| JP | 2014-165311 A | 9/2014 |
| KR | 10-2015-0011117 | 1/2015 |

OTHER PUBLICATIONS

International Search Report, corresponding to PCT/KR2016/008176, dated Nov. 17, 2016, 4 pages.
Notice of Allowance of corresponding KR 10-2015-0106318, dated Jan. 19, 2017, 2 pages.

* cited by examiner

METHOD OF PREPARING FOR REACTOR RESTART FOR MANUFACTURING EPITAXIAL WAFER

CROSS-REFERENCE TO RELATED APPLICATION(S)

This application is a National Phase Patent Application and claims priority to and the benefit of International Application Number PCT/KR2016/008176, filed on Jul. 26, 2016, which claims priority to Korean Patent Application Number 10-2015-0106318, filed on Jul. 28, 2015, the entire contents of all of which are incorporated herein by reference.

TECHNICAL FIELD

The present invention relates to a method of preparing for a restart of an inside of a chamber, and more particularly, to a method of preparing for a restart of an epitaxial reactor so as to remove moisture and impurities remaining in the chamber after completion of growth of an epitaxial wafer and manufacture a subsequent epitaxial wafer.

BACKGROUND ART

A conventional silicon wafer is manufactured through a single crystal growth process, a slicing process, a grinding process, a lapping process, a polishing process, and a cleaning process to remove abrasive or foreign substances adhering to a wafer after the polishing process.

A wafer produced by such a method is referred to as a polished wafer, and a wafer in which another monocrystalline film (epitaxial layer) is grown on a surface of a polished wafer is referred to as to an epitaxial wafer.

The epitaxial wafer has fewer defects than the polished wafer and has characteristics of controlling a concentration and kind of impurities. In addition, the epitaxial layer has high purity and excellent crystallinity, which is advantageous for improving an yield and device properties of a highly integrated semiconductor device. Chemical vapor deposition is a process of growing a thin layer of material on a target, such as a semiconductor wafer, whereby a layer having a different conductivity may be deposited on the wafer to produce desired electrical properties.

A chemical vapor deposition apparatus for depositing an epitaxial layer on a wafer surface is configured to include a process chamber in which an epitaxial layer is deposited, a susceptor mounted in the chamber, a heating lamp provided in upper and lower portions of the process chamber, and a gas injection unit for injecting a source gas onto a wafer. The source gas injected from the gas injection unit forms an epitaxial layer on a wafer placed on the susceptor.

A chamber of an epi reactor for growing an epitaxial layer on a wafer includes a lot of moisture including metal impurities generated when an epitaxial process is performed at a high temperature. When such impurities are present inside the chamber, it is impossible to manufacture a high-quality epitaxial wafer, and thus, after a manufacturing process of an epitaxial wafer is completed, it is necessary to remove impurities remaining inside the chamber and form an atmosphere in which an epitaxial process of a next batch may be performed.

That is, after various processes are performed inside the chamber, a preventive maintenance (PM) is executed. Accordingly, residual moisture and metal impurities are generated inside the chamber after the PM. Thus, a process of preparing for a restart of a growth apparatus is performed so that an epitaxial wafer may be manufactured.

When a restart procedure of an epitaxial growth system is performed, a process recipe is provided for removing moisture and various contamination sources remaining in a thermally stabilized state in the epitaxial reactor, and steps of heating and stabilizing inside the chamber for a sufficient time to secure the quality of the wafer are repeated to perform the restart procedure.

However, since productivity of an epitaxial wafer decreases as the time for performing a restart procedure takes longer, it is necessary to find out a method capable of improving the productivity of an epitaxial wafer by reducing the time required for a restart procedure of an epitaxial reactor.

DISCLOSURE

Technical Problem

The present invention has been proposed to solve the above-mentioned problems, and the present invention provides a method of discharging moisture and contamination sources to the outside of a process chamber more effectively in a process of preparing for a restart of an epitaxial reactor for manufacturing an epitaxial wafer and shortening the restart time of the reactor.

Technical Solution

As a process of preparing for a restart of an epitaxial reactor in which epitaxial growth for a wafer is performed, an embodiment may include steps of: injecting a nitrogen gas into a process chamber provided in the epitaxial reactor and purging the gas for a predetermined time heating the inside of the process chamber non-linearly according to time; and measuring MCLT for the epitaxial wafer after growing the epitaxial wafer.

In an embodiment, the step of injecting a nitrogen gas into a process chamber provided in the epitaxial reactor and purging the gas for a predetermined time is performed simultaneously with a step of purging a source gas and a carrier gas into a gas line that simultaneously injects a gas into the process chamber.

The source gas may be a trichlorosilane (TCS) gas, and the carrier gas may be a $H_2$ gas.

In addition, the step of injecting a nitrogen gas into a process chamber provided in the epitaxial reactor and purging the gas for a predetermined time, and the step of purging a TCS gas into a gas line that injects a gas into the process chamber are performed for at least two hours or longer.

An embodiment may further include a step of heating the process chamber to a predetermined first temperature and then stabilizing the process chamber, after the inside of the process chamber is purged with a nitrogen gas. Preferably, the first temperature may be set in the range of 800 to 840° C.

In addition, the step of non-linearly heating the inside of the process chamber according to time may include a step of setting a power of a heat source corresponding to the first temperature to increase stepwise according to time after stabilizing the inside of the process chamber to the first temperature.

The step of non-linearly heating the inside of the process chamber according to time may include steps of heating and stabilizing the inside of the process chamber to a predetermined first temperature and baking the inside of the process chamber to a predetermined range of second temperature.

Preferably, the second temperature may be set in the range from 800 to 1200° C., which is a limit temperature at which fusion does not occur in a reflector included in an epitaxial reactor.

In an embodiment, a step of introducing a hydrogen gas into upper and lower portions of a susceptor may be performed while performing the step of non-linearly heating the inside of the process chamber according to time. Preferably, the power of the heat source may be set to be in the range of 40 to 95 kW.

In addition, a process of setting the power of the heat source to increase stepwise according to time is performed at least one or more, and a step of equalizing temperatures of upper and lower portions of a susceptor is performed after a baking process of the process chamber is completed.

In an embodiment, the step of equalizing the temperatures of upper and lower portions of the susceptor may be performed by changing emissivity of an upper or lower portion dome of the process chamber.

An embodiment may include repeatedly performing a process of depositing a silicon film on a surface of a susceptor and then etching and removing the silicon film.

In an embodiment, after the step of heating the inside of the process chamber non-linearly according to time, a step of confirming whether a residual dopant exists or not inside the process chamber is performed.

The step of confirming whether a residual dopant exists or not inside the process chamber may further perform manufacturing an intrinsic wafer with no dopant inside the process chamber and measuring a resistivity of the intrinsic wafer and measuring a resistivity of the intrinsic wafer at a subsequent step when a resistivity of the intrinsic wafer is less than a preset value.

In addition, a process of removing the epitaxial wafer from the inside of the process chamber and cleaning the process chamber after the epitaxial wafer is manufactured is repeatedly performed.

In an embodiment, the step of measuring MCLT for the epitaxial wafer is performed at the time of a plurality of Runs proceeding when a process of manufacturing one epitaxial wafer is referred to as one Run.

The epitaxial wafer is manufactured as a dummy wafer, and a wafer corresponding to a Run in which actual MCLT measurement is performed may be manufactured as an actual wafer.

In an embodiment, when the MCLT reaches a predetermined value, a step of preparing for a restart of an epitaxial reactor is completed.

Advantageous Effects

According to an embodiment, a method of preparing a reactor for manufacturing an epitaxial wafer purges and dries an inside of a process chamber using a nitrogen gas at room temperature for a certain period of time after a PM process is performed, and thus it is possible to shorten a time required to prepare for a restart of a reactor compared with the related art.

According to an embodiment, a method of preparing a reactor for manufacturing an epitaxial wafer raises stepwise power of a heat source for transferring heat to an inside of a process chamber in a step of baking the inside of the process chamber after a PM process is completed. Accordingly, moisture and contaminants stagnated in the process chamber may cause an unstable flow so as to be effectively discharged according to a flow of a hydrogen gas.

According to an embodiment, as moisture and contaminants stagnated in a process chamber are removed at a faster rate than a method of preparing for a restart of an epitaxial reactor of the related art, a time to reach a minimum value of MCLT for performing a restart of an epitaxial reactor may be reduced. Accordingly, a time for preparing for a restart of a reactor also decreases, and thus productivity of an epitaxial wafer can also be improved.

MODES OF THE INVENTION

Exemplary embodiments of the present disclosure will be described in detail below with reference to the accompanying drawings. However, the present disclosure is not restricted or limited to the exemplary embodiments. In the description of the present disclosure, detailed descriptions of well-known functions or configurations may be omitted to clarify the gist of the present disclosure.

In an embodiment, a preventive maintenance (PM) is executed for an epitaxial reactor, and then a process recipe for a restart procedure to remove moisture and contaminants stagnated in the epitaxial reactor is proposed, thereby reducing a time required for a restart procedure compared with a conventional method.

Figure 1:
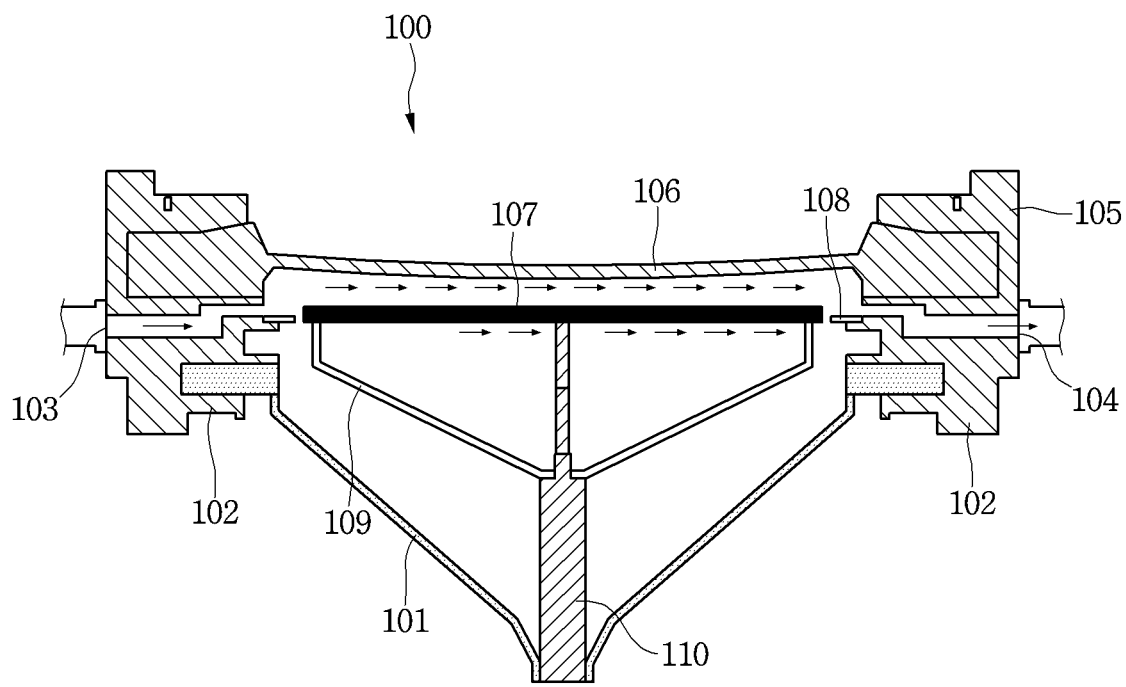
FIG. 1 is a view illustrating an epitaxial reactor to be applied for preparing for a restart of an epitaxial reactor of an embodiment.

FIG. 1 is a view illustrating an epitaxial growth system applied to a preparation procedure of a restart of an epitaxial reactor of an embodiment.

Referring to FIG. 1, an epitaxial growth system 100 may be configured to include an upper portion liner 105 and a lower portion liner 102, an upper portion cover 106, a lower portion cover 101, a susceptor 107, a preheating ring 108, a susceptor support 109, a gas inlet 103, a gas outlet 104, and a main shaft 110.

The gas inlet 103 connected to a gas supply line is formed at one side of the epitaxial growth system 100, the gas outlet 104 connected to a gas discharge line may be formed at the other side of the epitaxial growth system 100, and the epitaxial growth system 100 may include the lower portion cover 101 and the upper portion cover 106.

The lower portion liner 102 may be disposed to surround the susceptor 107, and the upper portion liner 105 may be provided to face an upper portion of the lower portion liner 102. The preheating ring 108 is formed in a ring shape along an inner surface of the lower portion liner 102 adjacent to the susceptor 107 and is seated on the lower portion liner 102, and the preheating ring 108 is disposed to surround the susceptor 107, so that a temperature of a gas transmitted to a wafer is uniform.

The susceptor 107 is a portion on which a wafer is mounted while an epitaxial process is performed, and the susceptor 107 may be configured with a plate made of a material such as carbon graphite or silicon carbide. The susceptor 107 is supported by the main shaft 110 located at a lower portion of the susceptor 107 and the susceptor support 109 formed at various positions in an edge direction of the susceptor 107 in the main shaft 110. An epitaxial process may be performed while the susceptor 107 is fixed at the same height as the height of the preheating ring 108 as shown in FIG. 1.

A epitaxial film is vapor-grown on a wafer at a high temperature in a process chamber inside an epitaxial reactor as described above, which produces an epitaxial wafer. At this point, when metal impurities or residual moisture are present inside the process chamber, a manufactured epitaxial wafer is contaminated by metal impurities, and thus the quality of an epitaxial wafer can not be guaranteed.

Accordingly, the process chamber performs a preventive maintenance (PM) after various processes are performed, and thus residual moisture is generated inside the process chamber after the PM. In order to solve this problem, residual moisture may be removed through a process such as baking the inside of the chamber.

Figure 2:
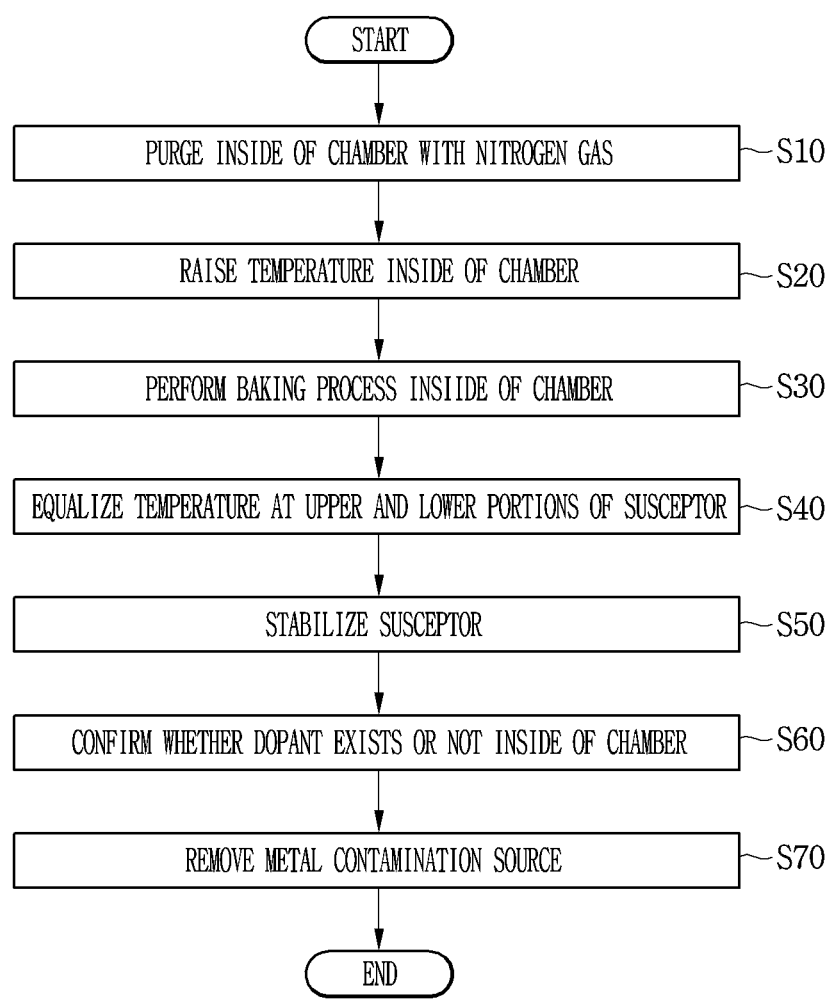
FIG. 2 is a flowchart illustrating a method of preparing for a restart of an epitaxial reactor according to an embodiment.

FIG. 2 is a flowchart illustrating a method of preparing for a restart of an epitaxial reactor according to an embodiment. Referring to FIG. 2, the method of preparing for a restart of an epitaxial reactor according to an embodiment is performed after the manufacturing of an epitaxial wafer is completed, and then the PM is performed inside a reactor. The method of preparing for a restart of an epitaxial reactor may include purging the inside of the process chamber with a nitrogen gas in step S10, raising a temperature inside the chamber in step S20, baking the inside of the chamber in step S30, equalizing temperatures of upper and lower portions of a susceptor in step S40, stabilizing the susceptor in step S50, confirming whether a dopant exists or not in the process chamber in step S60, and removing metal contamination sources inside the process chamber in step S70.

Describing each of the steps in detail, the step S10 of purging inside the process chamber with a nitrogen gas is a step of injecting a nitrogen gas through a gas inlet while maintaining the inside of the process chamber at room temperature and then circulating inside the process chamber and discharging the gas through a gas outlet. The step S10 may be performed inside the process chamber preferably for about 3 hours, which may vary depending on a state of the inside of the chamber.

In addition, while purging the inside of the process chamber, the purging may be performed on a gas line that injects and discharges a gas into and out of the process chamber, and a source gas and a carrier gas are flowed and supplied into a gas line for a certain period of time, thereby forming an atmosphere capable of removing foreign substances and moisture remaining in the gas line. At this point, trichlorosilane (TCS) may be used as a source gas, and $H_2$ may be used as a carrier gas.

In an embodiment, unlike the process of raising a temperature of the process chamber in preparing for a restart of a reactor after a conventional PM is performed, the step S10 of circulating a nitrogen gas is performed, thereby forming an atmosphere inside the process chamber for faster removal of residual moisture and pollutants inside the process chamber.

In the step S20 of raising a temperature inside the process chamber, temperature inside the process chamber is raised to a predetermined first temperature according to time and stabilized while maintaining the inside of the process chamber at the first temperature for about 10 minutes. At this point, the first temperature may be selected in the range of 800 to 840° C.

The step S30 of baking the inside of the chamber is a step of non-linearly heating the inside of the process chamber according to time, and the step may be performed by setting a power value applied to the process chamber to increase stepwise.

The inside of the process chamber may be set so that a power of a heat source is sequentially increased from 40 kW to 95 kW, which is a corresponding a power of a heat source, in a state where the predetermined first temperature is maintained at 800° C., and an increment for each step may be set to 10 kW. For example, heat is applied to the process chamber at a power of 40 kW for a certain period of time, and then heat is applied to the process chamber at a power of 50 kW for a certain period of time, and then a power value may increase sequentially up to 95 kW.

As the power of the heat source is gradually increased, the temperature inside the process chamber may rise up to a predetermined second temperature, and the second temperature may be set within the range of 800 to 1200° C. In the process chamber applied to an embodiment, since a reflector configured in an epitaxial reactor may be melted when a power value of 95 kW is applied, the temperature of 1200° C. corresponding to the power of 95 kW is set to be raised to a threshold temperature. When the power of the heat source is constant, a temperature change inside the process chamber linearly changes. However, when the power of the heat source is increased stepwise as in an embodiment, a temperature change inside the process chamber changes non-linearly.

As described above, the power of the heat source gradually increases according to time and is set to a different value for each step. Accordingly, a thermal state inside the process chamber becomes a unstable state, and thus kinetic energy of particles including moisture and contaminants contained in the process chamber is increased. In an embodiment, while preparing for a restart of an epitaxial reactor, a process of stepwise increasing the power of the heat source for raising a temperature inside the process chamber in the step of baking the inside of the process chamber may be repeated several times. Preferably, the process may be performed two to five times depending on efficiency of the baking process. At this point, a process of introducing a hydrogen gas into upper and lower portions of the susceptor may be performed.

The inside of the process chamber becomes thermally unstable as the process of raising a temperature inside the process chamber is performed, and when a hydrogen gas is introduced into the process chamber through a main valve and a slit valve, moisture and substances inside the process chamber may be more effectively discharged by the transfer of a hydrogen gas.

That is, the step of raising the inside of the process chamber to a higher temperature compared to the related art to make a thermal state inside the process chamber nonuniform is performed, and thus a discharging speed of moisture and residue inside the process chamber can be further increased.

The step S40 of equalizing temperatures of upper and lower portions of a susceptor makes temperatures of upper and lower covers of the process chamber corresponding to upper and lower portions of the susceptor equal after making a temperature inside the process chamber thermally unstable, which removes various impurities. This step may be a preparation process for a stabilization process of a replaced susceptor. After measuring temperatures of the upper and lower covers, and when the temperature values are different, emissivity of the upper and lower covers may be adjusted, and intensity of the heat delivered from the heater may be changed, and thus a temperature inside the process chamber can be kept the same.

The step S50 of stabilizing a susceptor may include depositing a silicon film on a surface of the susceptor used for manufacturing an epitaxial wafer or a replaced susceptor, and then etching and removing the silicon film.

A susceptor used in a previous process contains moisture or contaminants on a contact surface with a wafer after a high temperature process, and a replaced susceptor may also have metal substances and various residues adsorbed on a surface thereof. Therefore, it is necessary to stabilize a susceptor surface in order to remove moisture, contaminants, metal substances, and various residues. In an embodiment, a silicon gas is flowed onto a surface of a susceptor for 120 seconds and forms a silicon film of 4 to 5 μm, and then an etching gas is flowed onto the silicon film for 90 seconds, which removes the silicon film. This process is performed about 4 times, and thus a susceptor is stabilized.

The step S60 of confirming whether a dopant exists or not inside the process chamber is a process to measure resistivity of an epitaxial wafer and to determine whether a dopant remains inside the process chamber. The step may include a step of putting a wafer into the process chamber and manufacturing an epitaxial wafer having a thickness of 10 um, and extracting the epitaxial wafer after a predetermined time and measuring resistivity of the wafer. An intrinsic epitaxial wafer will be grown without doping a dopant inside the process chamber. An intrinsic epitaxial wafer will have a constant resistivity, but when this value is changed, it can be determined that a dopant remains inside the process chamber, and a resistivity value of the wafer changes.

Therefore, in an embodiment, when resistivity of a wafer does not satisfy the level of 300 ohm-cm, CP MCLT Recovery, which is a next step, may be performed while additionally checking resistivity of a wafer and determining whether a dopant remains.

The step S70 of removing a metal contamination source inside the process chamber is a step of growing an epitaxial film on a wafer and performing a chemical passivation (CP) recovery process. The step S70 is a step for measuring an MCLT level inside the process chamber, and repeats the step of putting a wafer into the process chamber and manufacturing an epitaxial wafer. When a process of cleaning and etching inside the process chamber after manufacturing one epitaxial wafer is one Run, a step of measuring an MCLT for an epitaxial wafer at the time of executing a plurality of runs may be performed. In an embodiment, epitaxial wafers corresponding to 50, 100, 150, 200, and 250 Runs are extracted as a sampling wafer and an MCLT value is measured.

Wafers used in each Run may be dummy wafers, and epitaxial wafers may be manufactured with actual wafers in Runs corresponding to 50, 100, 150, 200, and 250 Runs and utilized as sampling wafers.

After a sampling wafer having an epitaxial film formed thereon is removed from the process chamber, a process of removing a native oxide film through a hydrofluoric acid process is performed. In addition, iodine is thinly deposited on an epitaxial wafer, and then a surface of the wafer is scanned to measure a level of MCLT.

The minority carrier lifetime (MCLT) may be a measure determining the readiness of a restart of an epitaxial growth system. The MCLT refers to an average time taken for recombination of excessive minority electrons, and the more impurities in a process chamber, the lower an MCLT.

Therefore, MCLTs of sample wafers corresponding to 50, 100, 150, 200, and 250 Runs are measured, and when an MCLT satisfies a predetermined value, it may be determined that a preparation for a restart of an epitaxial growth system is completed. When an MCLT value does not satisfy a predetermined value, the steps corresponding to steps S10 to S60 are repeated to secure an MCLT level required for preparation for a restart. In an embodiment, when an MCLT reaches a predetermined value, a restart procedure of an epitaxial growth system is completed, and the predetermined value is set to 2500 us, which refers that contaminants such as metal particles that are present inside the process chamber are almost removed and do not affect quality of an epitaxial wafer that is subsequently manufactured.

Figure 3:
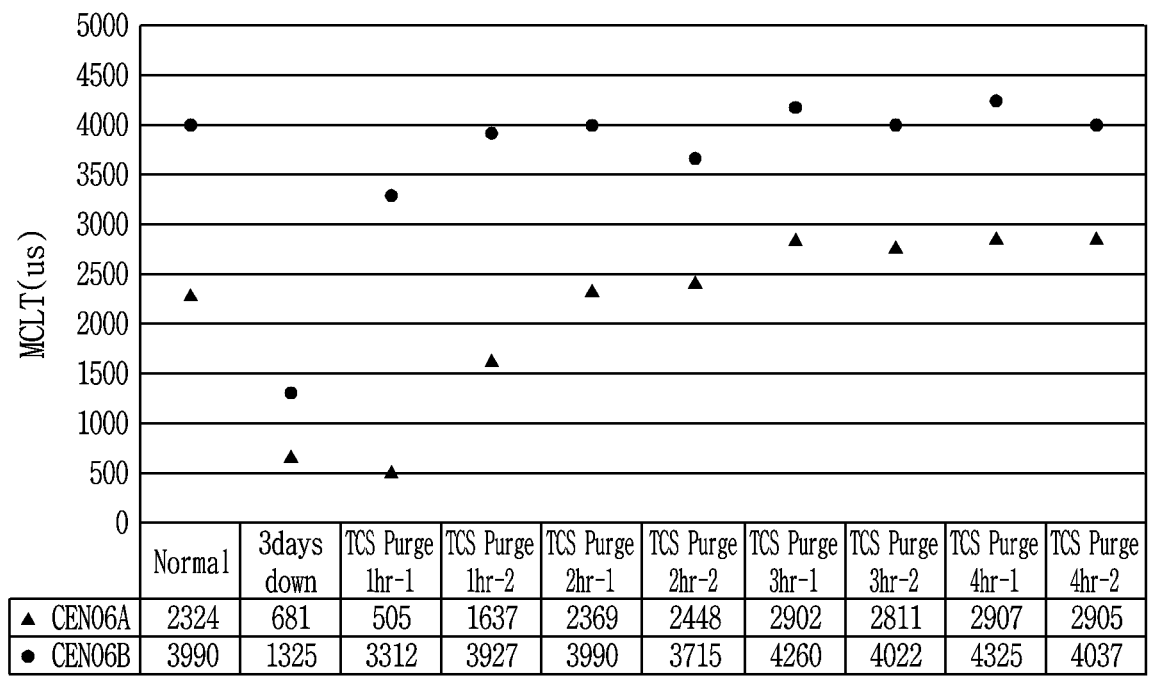
FIG. 3 illustrates a case where a TCS gas is purged according to an embodiment.

FIG. 3 illustrates a case where a TCS gas is purged according to an embodiment.

Referring to FIG. 3, a level of MCLT is shown when a nitrogen gas is purged into the process chamber in step S10 of an embodiment, and at the same time, a TCS gas is purged into the gas line. In results of measuring MCLT levels for two epitaxial reactors (CEN06A, CEN06B), when a TCS gas is not purged (Normal) in a gas line, levels of MCLT are 2324 μs and 3990 μs respectively. However, when a TCS gas is purged in a gas line for a certain period of time, it can be seen that an MCLT level is increased rapidly when a TCS gas is purged for at least 2 hours or more.

Figure 4:
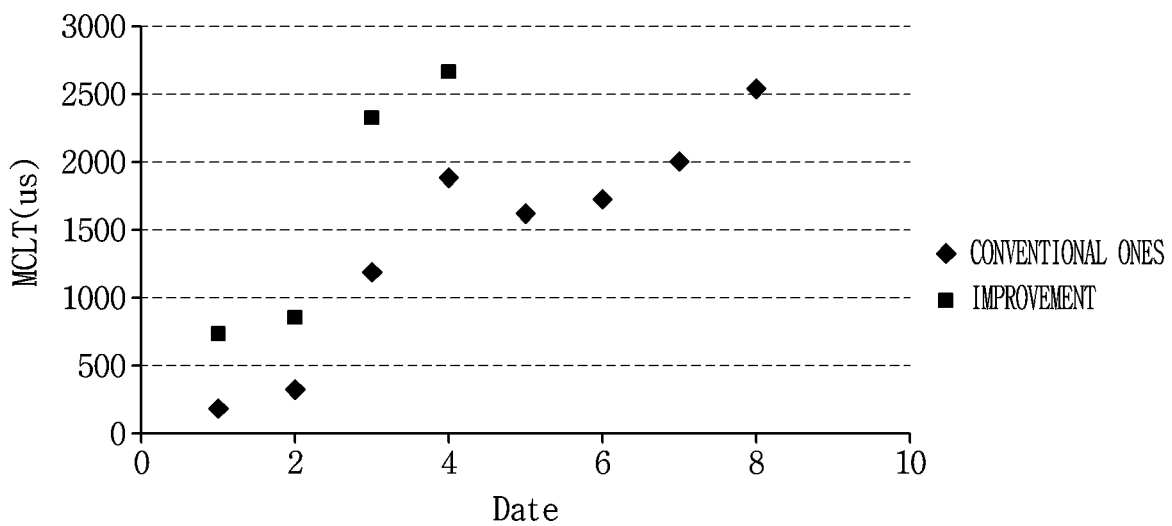
FIG. 4 is a graph illustrating a change in a level of MCLT inside a process chamber according to the related art and an embodiment in a method of preparing an epitaxial reactor.

FIG. 4 is a graph illustrating a change in a level of MCLT inside a process chamber according to the related art and an embodiment in a method of preparing an epitaxial reactor. In the case of an embodiment, compared to the related art, purging the inside of the process chamber with a nitrogen gas and purging a gas line with a TCS gas, baking the inside of the chamber, and removing a metal contamination source inside the process chamber are further performed. When the above-mentioned process is not performed, a time for preparing for a restart of an epitaxial reactor takes 8 days to satisfy the MCLT level of 2500 μs required for the restart. However, when the preparation process like an embodiment is performed, it can be confirmed that the time for preparing for a restart of an epitaxial reactor takes 4 days to satisfy the MCLT level of 2500 μs, which is required for the restart, and it can be determined that a time required for a restart of an epitaxial reactor is shortened to about a half.

Figure 5:
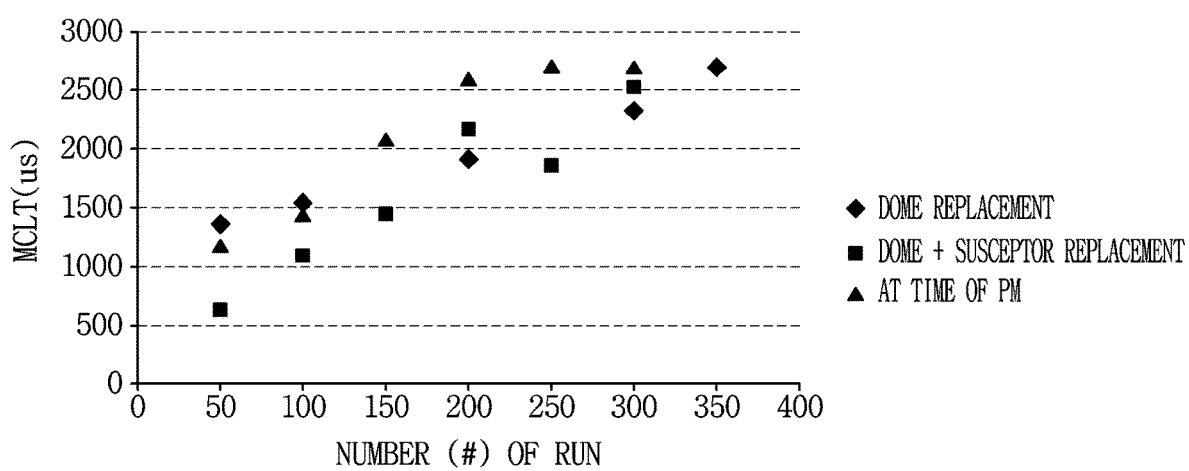
FIG. 5 is a graph illustrating a change in a level of MCLT inside a process chamber according to a type of preparing for a restart of an epitaxial reactor.

FIG. 5 is a graph illustrating a change in an MCLT level inside the process chamber due to equipment replacement during preparation of a restart of an epitaxial reactor. Consumable equipment in the manufacturing of an epitaxial wafer may require replacement after manufacturing of an epitaxial wafer has been repeated several times or more. An upper dome and a susceptor on which a wafer is mounted are mainly replaced, and FIG. 5 illustrates a time taken to prepare for a restart of an epitaxial reactor with the MCLT level when an upper dome or a susceptor is replaced.

At the time of PM, that is, without replacement of equipment inside an epitaxial reactor, an MCLT reached about 2500 μs, at which an epitaxial reactor may be restarted, at about 200 Runs of an epitaxial wafer. When an upper dome is replaced, an MCLT reaches about 2500 μs at 300 Runs, which is capable of restarting an epitaxial reactor, and when an upper dome and a susceptor are exchanged at the same time, an MCLT reached about 2500 μs at about 350 Run, which is capable of restarting an epitaxial reactor.

This indicates that a relatively large amount of contaminants such as metal particles are attached to a surface of replaced equipment where an epitaxial process is not performed. When epitaxial reactor equipment is replaced, steps S10 to S70 described in an embodiment may be repeatedly performed, so that a level of MCLT required for a restart may be achieved.

As described above, according to an embodiment, a method of preparing a reactor for manufacturing an epitaxial wafer is performed by purging and drying the inside of the process chamber using a nitrogen gas at room temperature for a certain period of time after completion of a PM process. In the step of baking the inside of the process chamber, the power of the heat source for transferring heat into the process chamber is increased stepwise, thereby effectively discharging moisture and contaminants stagnated inside the process chamber. In addition, a Run is also performed to manufacture an epitaxial wafer repeatedly, and a level of metal contaminants remaining in an epitaxial reactor is checked by identifying an MCLT level for an epitaxial wafer in a particular Run.

With the method of preparing the reactor as described above, an embodiment may reduce a time for preparing for a restart of a reactor compared to a conventional method, and may also improve productivity of an epitaxial wafer.

While exemplary embodiments have been described with respect to the present disclosure, the above exemplary embodiments are merely examples and the present invention is not limited thereto. It will be apparent to those skilled in the art that various modifications and applications can be made to the above-described exemplary embodiments of the present disclosure without departing from the spirit or scope of the disclosure. For example, elements of the exemplary embodiments described herein may be modified and realized. Also, it should be construed that differences related to such modifications and applications are included in the scope of the present invention defined in the appended claims.

INDUSTRIAL APPLICABILITY

The present invention is industrially applicable, since a discharging rate of moisture and contaminants stagnated inside a process chamber may be increased, and a time for preparing for a restart of a reactor may be reduced, and thus productivity of an epitaxial wafer may be improved.

The invention claimed is:

1. A method of preparing for a restart of an epitaxial reactor, as a process of preparing for a restart of an epitaxial reactor in which epitaxial growth for a wafer is performed, the method comprising steps of:
   simultaneously injecting a nitrogen gas through a gas inlet and a source gas and a carrier gas through a corresponding gas line into a process chamber provided in the epitaxial reactor to purge the inside of the process chamber for a predetermined time;
   stepwise-increasing a power of a heat source within a predetermined first temperature and a predetermined second temperature to non-linearly change a temperature change of the inside of the process chamber according to time; and
   measuring MCLT for the epitaxial wafer after growing the epitaxial wafer.

2. The method of preparing for a restart of an epitaxial reactor of claim 1, wherein the source gas is a trichlorosilane (TCS) gas, and the carrier gas is a $H_2$ gas.

3. The method of preparing for a restart of an epitaxial reactor of claim 1, wherein the step of injecting a nitrogen gas into a process chamber provided in the epitaxial reactor and purging the gas for a predetermined time, and the step of purging a TCS gas into a gas line that injects a gas into the process chamber are performed for at least two hours or longer.

4. The method of preparing for a restart of an epitaxial reactor of claim 1, further comprising a step of heating the process chamber to the predetermined first temperature and then stabilizing the process chamber, after the inside of the process chamber is purged with a nitrogen gas.

5. The method of preparing for a restart of an epitaxial reactor of claim 4, wherein the first temperature is set in the range of 800 to 840° C.

6. The method of preparing for a restart of an epitaxial reactor of claim 4, wherein the step of non-linearly heating the inside of the process chamber according to time is performed after stabilizing the inside of the process chamber to the first temperature.

7. The method of preparing for a restart of an epitaxial reactor of claim 1, wherein the step of non-linearly heating the inside of the process chamber according to time includes steps of heating and stabilizing the inside of the process chamber to a predetermined first temperature and baking the inside of the process chamber to the predetermined second temperature.

8. The method of preparing for a restart of an epitaxial reactor of claim 7, wherein the second temperature is set in the range from 800 to 1200° C. which is a limit temperature at which fusion does not occur in a reflector included in an epitaxial reactor.

9. The method of preparing for a restart of an epitaxial reactor of claim 1, wherein a step of introducing a hydrogen gas into upper and lower portions of a susceptor is performed while performing the step of non-linearly heating the inside of the process chamber according to time.

10. The method of preparing for a restart of an epitaxial reactor of claim 6, wherein the power of the heat source is set to be in the range of 40 to 95 kW.

11. The method of preparing for a restart of an epitaxial reactor of claim 6, wherein a process of setting the power of the heat source to increase stepwise according to time is performed at least one or more.

12. The method of preparing for a restart of an epitaxial reactor of claim 1, wherein a step of equalizing temperatures of upper and lower portions of a susceptor is performed after a baking process of the process chamber is completed.

13. The method of preparing for a restart of an epitaxial reactor of claim 12, wherein the step of equalizing the temperatures of upper and lower portions of the susceptor is performed by changing emissivity of an upper or lower portion dome of the process chamber.

14. The method of preparing for a restart of an epitaxial reactor of claim 1, comprising repeatedly performing a process of depositing a silicon film on a surface of a susceptor and then etching and removing the silicon film.

15. The method of preparing for a restart of an epitaxial reactor of claim 1, wherein after the step of heating the inside of the process chamber non-linearly according to time, a step of confirming whether a residual dopant exists or not inside the process chamber is performed.

16. The method of preparing for a restart of an epitaxial reactor of claim 15, wherein the step of confirming whether a residual dopant exists or not inside the process chamber further performs manufacturing an intrinsic wafer with no dopant inside the process chamber and measuring a resistivity of the intrinsic wafer and measuring a resistivity of the intrinsic wafer at a subsequent step when a resistivity of the intrinsic wafer is less than a preset value.

17. The method of preparing for a restart of an epitaxial reactor of claim 1, wherein a process of removing the epitaxial wafer from the inside of the process chamber and cleaning the process chamber after the epitaxial wafer is manufactured is repeatedly performed.

18. The method of preparing for a restart of an epitaxial reactor of claim 1, wherein the step of measuring MCLT for the epitaxial wafer is performed at the time of a plurality of Runs proceeding when a process of manufacturing one epitaxial wafer is referred to as one Run.

19. The method of preparing for a restart of an epitaxial reactor of claim 18, wherein the epitaxial wafer is manufactured as a dummy wafer, and a wafer corresponding to a Run in which actual MCLT measurement is performed is manufactured as an actual wafer.

* * * * *